(12) United States Patent
Miyata et al.

(10) Patent No.: US 8,940,365 B2
(45) Date of Patent: Jan. 27, 2015

(54) COATING METHOD, COATING DEVICE, AND STORAGE MEDIUM

(75) Inventors: Akira Miyata, Koshi (JP); Yoshitaka Hara, Koshi (JP); Kouji Fujimura, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 55 days.

(21) Appl. No.: 13/336,373

(22) Filed: Dec. 23, 2011

(65) Prior Publication Data

US 2012/0164572 A1 Jun. 28, 2012

(30) Foreign Application Priority Data

Dec. 28, 2010 (JP) ................................. 2010-293240

(51) Int. Cl.
*B05D 3/12* (2006.01)
*G06F 19/00* (2011.01)
*H01L 21/67* (2006.01)

(52) U.S. Cl.
CPC ................................. *H01L 21/6715* (2013.01)
USPC ............. 427/240; 427/425; 118/52; 118/320; 438/780; 438/782; 700/121

(58) Field of Classification Search
USPC ............. 427/240, 425; 118/52, 320; 438/780, 438/782; 700/121
See application file for complete search history.

(56) References Cited

U.S. PATENT DOCUMENTS

| 6,878,401 B2 * | 4/2005 | Nishijima et al. ............ 427/240 |
| 7,641,763 B2 * | 1/2010 | Kobayashi et al. ...... 156/345.55 |
| 2006/0233952 A1 * | 10/2006 | Nakashima et al. .......... 427/240 |
| 2009/0169740 A1 * | 7/2009 | Teshima et al. ............... 427/240 |
| 2010/0051059 A1 * | 3/2010 | Kometani et al. ............... 134/21 |

FOREIGN PATENT DOCUMENTS

| JP | 2005-79302 A | 3/2005 |
| JP | 2010-62352 A | 3/2010 |

* cited by examiner

*Primary Examiner* — Kirsten Jolley
(74) *Attorney, Agent, or Firm* — Nath, Goldberg & Meyer; Jerald L. Meyer

(57) ABSTRACT

A device to form a coating film which can quickly coat a substrate of a follow-up lot after coating a preceding lot. The device is configured such that nozzles for a preceding lot and a following lot are integrated into a common movement mechanism and moved between an upper side of a liquid processing unit and a standby area. A coating method includes sucking air into the nozzle for the preceding lot to form an upper gas layer, sucking a solvent for the preceding lot in the standby area to form a thinner layer, and sucking air into the nozzle for the preceding lot to form a lower gas layer within the nozzle, and thus forming a state that a solvent layer is interposed between the upper gas layer and the lower gas layer.

9 Claims, 12 Drawing Sheets

DISCHARGE DIRECTION ↓

PROCESS SECOND WAFER WA 24 FROM LAST OF PRECEDING LOT A

DUMMY DISPENSE NOZZLE N2

PROCESS LAST WAFER WA25 OF PRECEDING LOT A

STORE THINNER T BY STANDBY BUS BA1 THROUGH WHICH
NOZZLE N1 SUCKS AIR WHILE IT IS MOVING

NOZZLE N1 SUCKS THINNER T BY STANDBY BUT BA1

NOZZLE N1 SUCKS AIR WHILE IT IS MOVING

PROCESS FIRST WAFER WB1 OF FOLLOWING LOT B BY NOZZLE N2

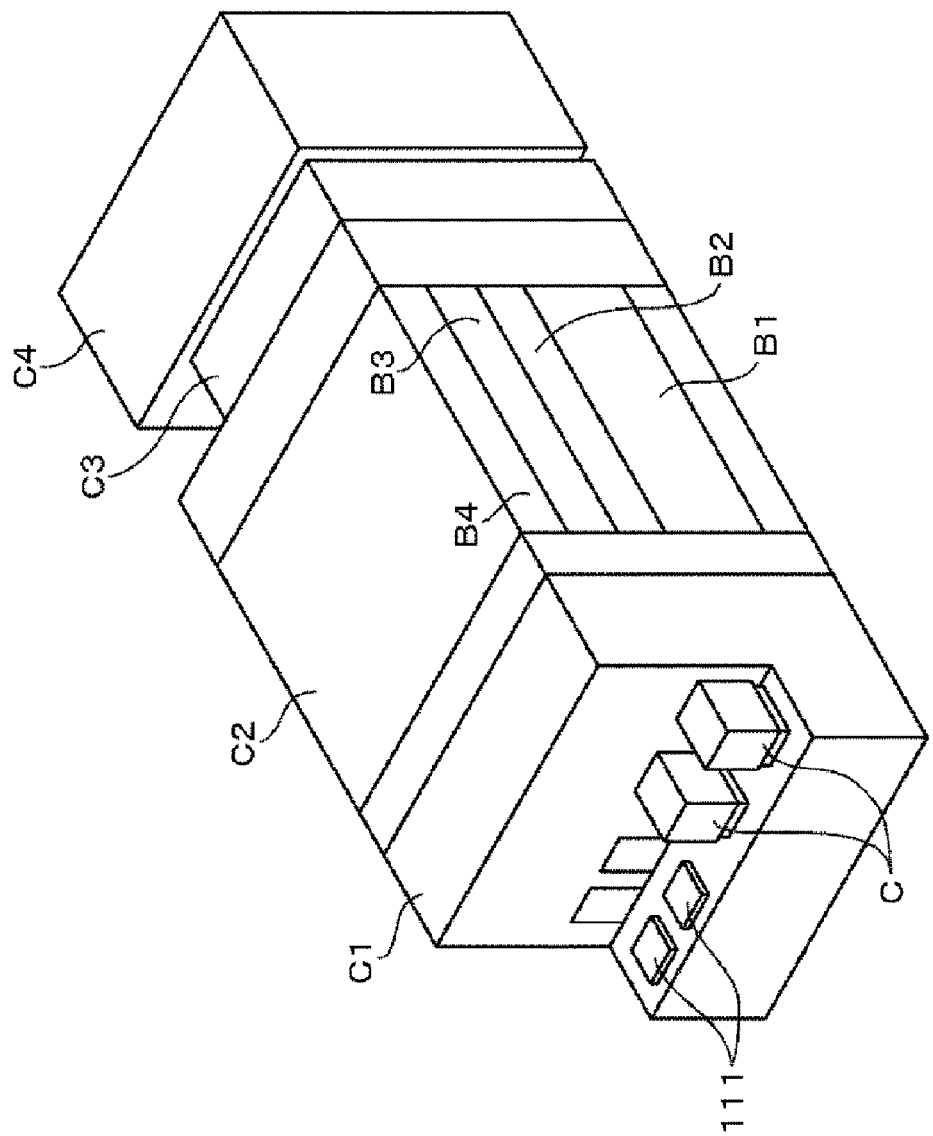

COATING METHOD, COATING DEVICE, AND STORAGE MEDIUM

CROSS-REFERENCE TO RELATED APPLICATION

This application claims the benefit of Japanese Patent Application No. 2010-293240, filed on Dec. 28, 2010, in the Japan Patent Office, the disclosure of which is incorporated herein in its entirety by reference.

TECHNICAL FIELD

The present disclosure relates to a technique of supplying a liquid chemical from a nozzle to a substrate to form a coating film.

BACKGROUND

A process of fabricating a semiconductor device includes applying a resist solution to a substrate to form a resist pattern, and in order to secure high throughput, in general, a plurality of liquid processing units are used. Also, as semiconductor devices are diversified, the types of resistor solutions increase, and accordingly, the number of application nozzles is increasing. Thus, there is a technique of configuring a nozzle unit by integrating a plurality of nozzles corresponding to a plurality of types of resistor solutions and using the nozzle unit for a plurality of liquid processing units universally.

In such a device, a nozzle not in use has a layered structure which includes an air layer, a solvent layer, and an air layer. The layered structure is formed to act as a so-called cover in order to prevent a resist solution at a front end portion of the nozzle from becoming dry. Further, in the coating process, when the nozzle starts to be used, such as when a lot of the substrate is changed or the like, a dummy dispensing is performed to release the layer structure, and then, the coating is performed with a new resist solution. However, when the coating of one lot is terminated, the nozzle (nozzle unit) is moved to a standby position, the layer structure of the used nozzle is formed, and dummy dispensing is performed on a separate nozzle used for a follow-up lot. Thus, when the lot of the substrate is changed, when the time the nozzle is kept in the standby position is lengthened, the initiation of coating is delayed although the substrate has been loaded within the liquid processing unit, thus generating an unnecessary preparation standby time.

In changing the nozzle, a coating method is known which is for processing a dummy dispense of a nozzle before terminating the discharge of resist solution by a nozzle which has been used before changing, instead of performing coating after changing the nozzle. However, since this method is available only when each nozzle can move between a position at which a resist solution is discharged to a substrate and a standby position at which dummy dispensing is performed, the method is based on a different precondition from the present disclosure which uses a common arm to support and move respective nozzles of a multi-nozzle.

SUMMARY

The present disclosure provides some embodiments of a technique of quickly moving to a process of a substrate of a follow-up lot after performing certain processing including a solvent suction operation at a front end portion of a nozzle which has been used until changing a lot of the substrate in a device having a universal nozzle for discharging a coating liquid to the substrate with respect to a plurality of liquid processing units, thus restraining an influence of the corresponding processing on throughput.

According to one embodiment of the present disclosure, a coating method for forming a coating film by supplying a coating liquid obtained by dissolving a component of a coating film in a solvent from a nozzle to a substrate is provided, wherein a device is configured such that a nozzle for a preceding lot and a nozzle for a following lot are integrated into a common movement mechanism and moved between an upper side of a liquid processing unit and a standby area, the coating method comprises:

supplying a coating liquid from the nozzle for the preceding lot to the last substrate of the preceding lot loaded in a first liquid processing unit;

moving the nozzle for the preceding lot along with the nozzle for the following lot to the standby area;

sucking air into the nozzle for the preceding lot to form an upper gas layer within the nozzle, simultaneously with moving the nozzle for the preceding lot;

sucking a solvent into the nozzle for the preceding lot in the standby area;

after a front substrate of the following lot is loaded to a second liquid processing unit different from the first liquid processing unit, moving the nozzle for the following lot along with the nozzle for the preceding lot to an upper side of a front substrate of the following lot;

supplying a coating liquid to the front substrate of the following lot from the nozzle for the following lot; and after sucking a solvent into the nozzle for the preceding nozzle, sucking gas of atmosphere into the nozzle for the preceding lot to form a lower gas layer within the nozzle so that a solvent layer is interposed between the upper gas layer and the lower gas layer.

According to another embodiment of the present disclosure, a coating method for forming a coating film by supplying a coating liquid obtained by dissolving a component of a coating film in a solvent from a nozzle to a substrate is provided, wherein a device is configured such that a nozzle for a preceding lot and a nozzle for a following lot are integrated into a common movement mechanism and moved between an upper side of a liquid processing unit and a standby area, the coating method comprises:

supplying a coating liquid from the nozzle for the preceding lot to the last substrate of the preceding lot loaded in a first liquid processing unit;

moving the nozzle for the preceding lot along with the nozzle for the following lot to the standby area;

after supplying a coating liquid, sucking air into the nozzle for the preceding lot to form an upper gas layer within the nozzle;

sucking a solvent into the nozzle for the preceding lot in the standby area;

after a front substrate of the following lot is loaded to a second liquid processing unit different from the first liquid processing unit, moving the nozzle for the following lot along with the nozzle for the preceding lot from the standby area to an upper side of the front substrate of the following lot;

sucking air into the nozzle for the preceding lot along with said moving the nozzle for the following lot to form a lower gas layer within the nozzle, and forming a state that a solvent layer is interposed between the upper gas layer and the lower gas layer; and after the nozzle for the following lot is moved to the upper side of the front substrate of the following lot, supplying a coating liquid to the corresponding substrate from the nozzle for the following lot.

According to yet another embodiment of the present disclosure, a coating device for forming a coating film by supplying a coating liquid obtained by dissolving a component of a coating film in a solvent from a nozzle to a substrate kept in a liquid processing unit is provided, and the coating device comprises:

first and second liquid processing units;

a movement mechanism configured such that a nozzle for a preceding lot and a nozzle for a following lot are integrated and moved between an upper side of the first and second liquid processing units and a standby area; and a controller configured to control the operations of the nozzle for the preceding lot and the nozzle for the following lot, wherein the controller is configured to:

supply a coating liquid from the nozzle for the preceding lot to the last substrate of the preceding lot loaded in the first liquid processing unit;

move the nozzle for the preceding lot along with the nozzle for the following lot to the standby area;

suck air into the nozzle for the preceding lot to form an upper gas layer within the nozzle, simultaneously with moving the nozzle for the preceding lot;

suck a solvent into the nozzle for the preceding lot in the standby area;

after a front substrate of the following lot is loaded to the second liquid processing unit different from the first liquid processing unit, move the nozzle for the following lot along with the nozzle for the preceding lot to an upper side of the front substrate of the following lot;

supply a coating liquid to the front substrate of the following lot from the nozzle for the following lot; and after sucking a solvent into the nozzle for the preceding nozzle, suck gas of atmosphere into the nozzle for the preceding lot to form a lower gas layer within the nozzle, and form a state that a solvent layer is interposed between the upper gas layer and the lower gas layer.

According to net another embodiment of the present disclosure, a method for controlling a coating device through a controller, the coating device for forming a coating film by supplying a coating liquid obtained by dissolving a component of a coating film in a solvent from a nozzle to a substrate kept in a liquid processing unit is provided, and the coating device includes:

first and second liquid processing units; and a movement mechanism configured such that a nozzle for a preceding lot and a nozzle for a following lot are integrated and moved between an upper side of the first and second liquid processing units and a standby area; and the controller configured to control the operations of the nozzle for the preceding lot and the nozzle for the following lot, wherein the controller has a program that causes the following method to be executed and the method comprises:

supplying a coating liquid from the nozzle for the preceding lot to the last substrate of the preceding lot loaded in the first liquid processing unit;

moving the nozzle for the preceding lot along with the nozzle for the following lot to the standby area;

after supplying a coating liquid, sucking air into the nozzle for the preceding lot to form an upper gas layer within the nozzle;

sucking a solvent into the nozzle for the preceding lot in the standby area;

after a front substrate of the following lot is loaded to a second liquid processing unit different from the first liquid processing unit, moving the nozzle for the following lot along with the nozzle for the preceding lot from the standby area to an upper side of the front substrate of the following lot;

sucking air into the nozzle for the preceding lot simultaneously with moving the nozzle for the following lot to form a lower gas layer within the nozzle, and forming a state that a solvent layer is interposed between the upper gas layer and the lower gas layer; and after the nozzle for the following lot is moved to the upper side of the front substrate of the following lot, supplying a coating liquid to a corresponding substrate from the nozzle for the following lot.

According to yet another embodiment of the present disclosure, a storage medium storing a computer program used in a coating device for forming a coating film by supplying a coating liquid obtained by dissolving a component of a coating film in a solvent from a nozzle to a substrate kept in a liquid processing unit is provided, and the coating device comprises:

first and second liquid processing units; and a movement mechanism configured such that a nozzle for a preceding lot and a nozzle for a following lot are integrated and moved between an upper side of the first and second liquid processing units and a standby area, wherein the computer program includes a group of steps to execute the coating method described above.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 11 is a perspective view of the coating/developing device.

DETAILED DESCRIPTION

Embodiments of the present disclosure will now be described in detail with reference to the accompanying drawings.

Figure 1:
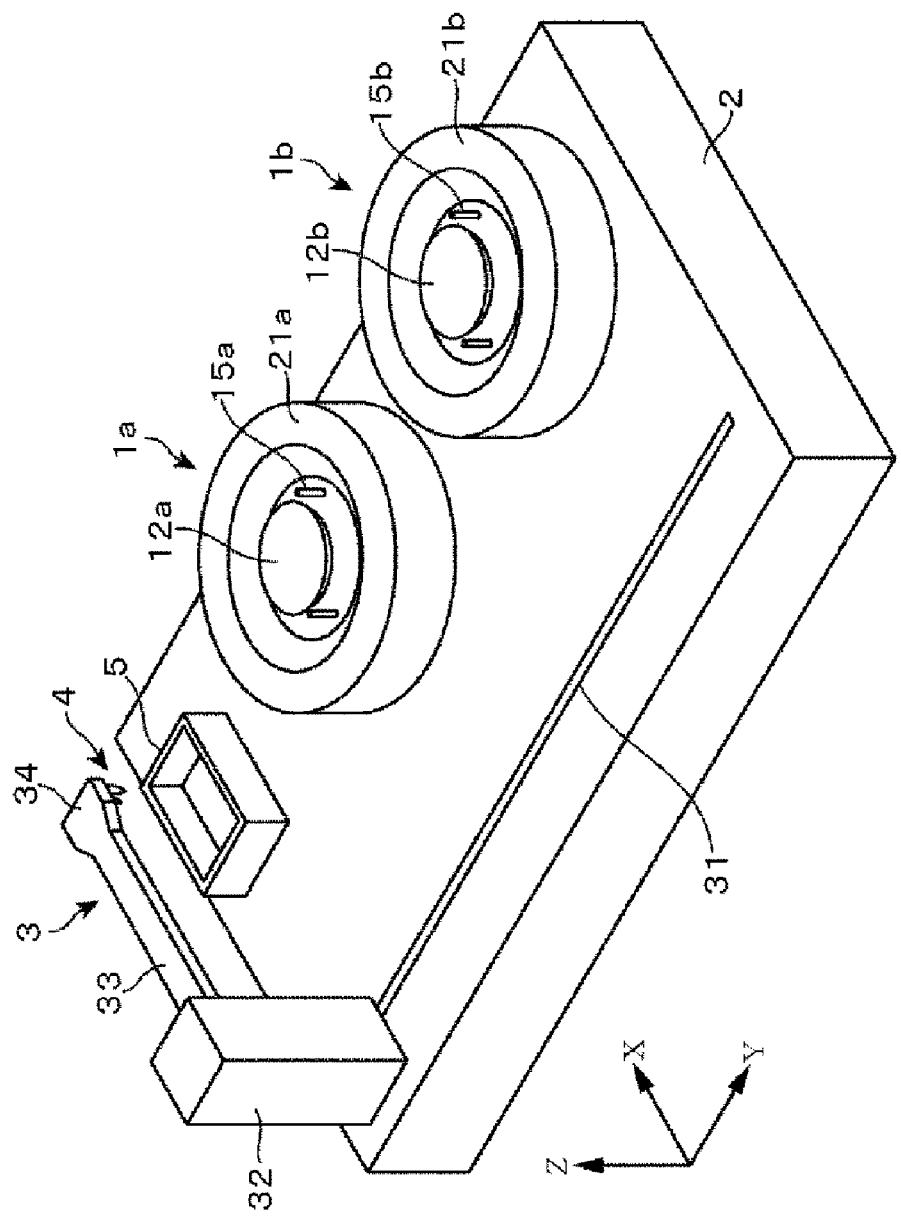
FIG. 1 is a perspective view of a resist coating device according to an embodiment of the present disclosure.
Figure 2:
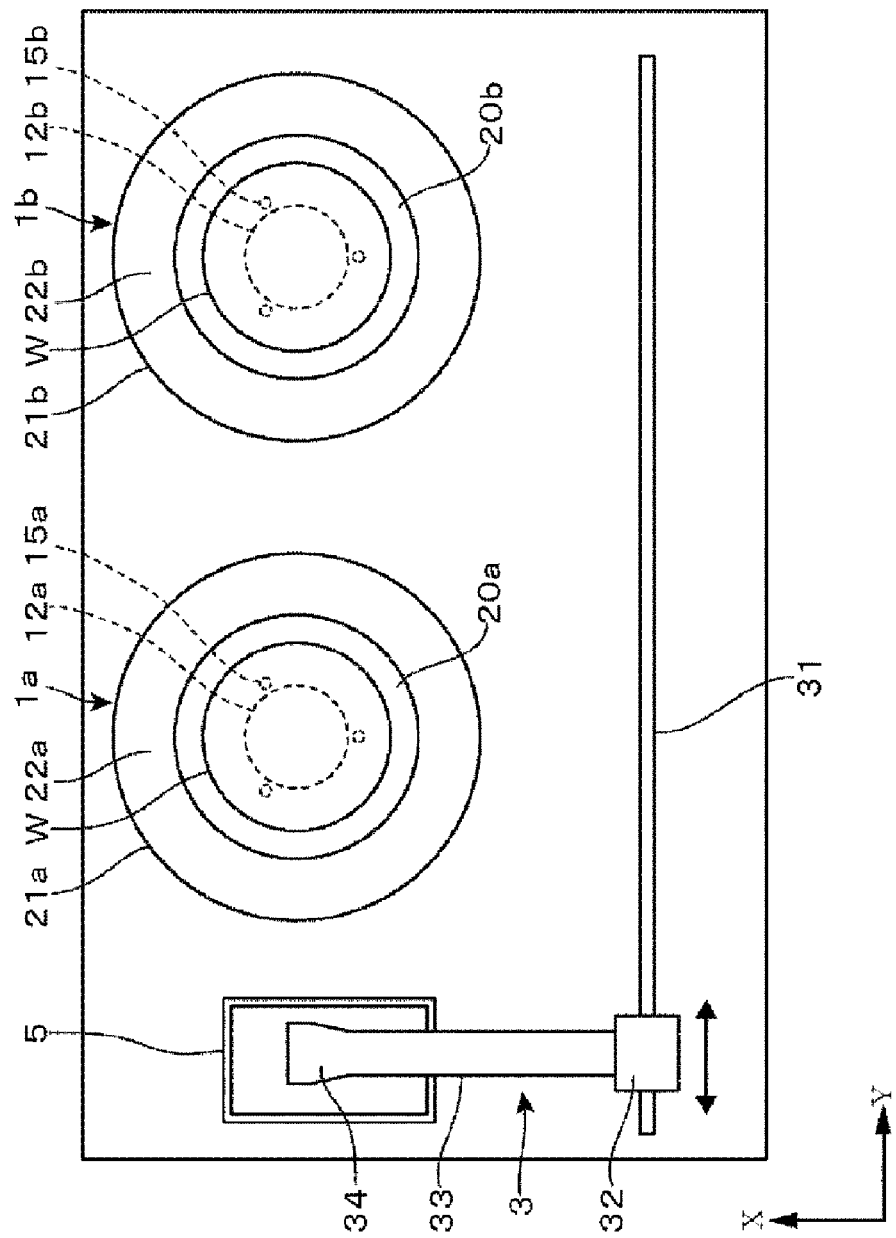
FIG. 2 is a plan view of the resist coating device.
Figure 3:
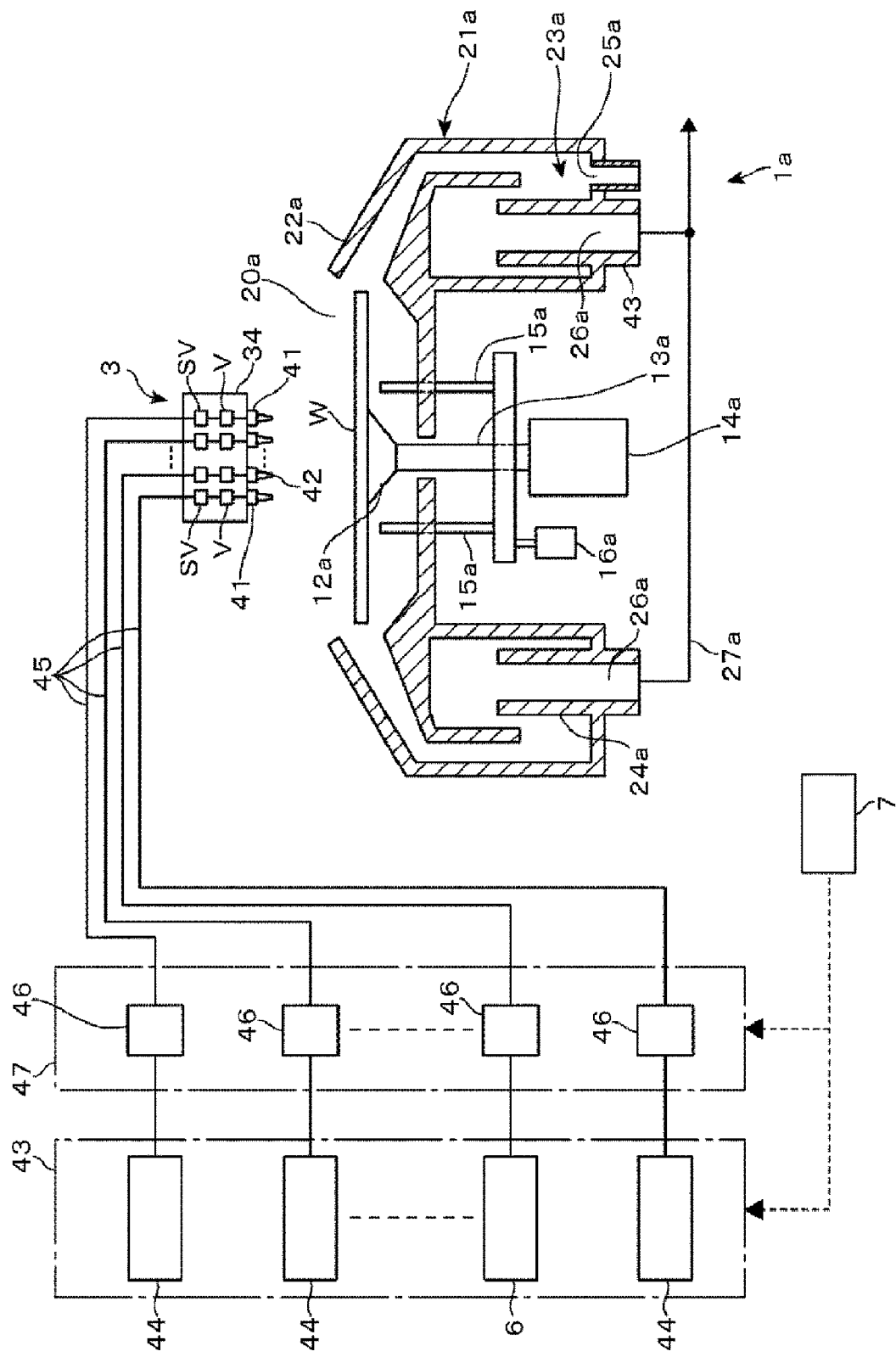
FIG. 3 is a vertical side view of the resist coating device.

FIGS. 1 to 3 are a perspective view, a plan view, and a vertical side view of a resist coating device employing a coating method according to an embodiment of the present disclosure. The resist coating device includes two coating processing units 1a and 1b as liquid processing units, a movement mechanism 3 for maintaining and moving a nozzle discharging a coating liquid, and a nozzle bus 5 installed at a standby area of the nozzle. In addition, although not shown, a circumferential portion resist film removing mechanism for removing a resist film at a circumferential portion of a wafer W is installed in each of the coating processing units 1a and 1b.

The coating processing units 1a and 1b are disposed to be parallel in a horizontal direction (Y direction in FIG. 1). The coating processing units 1a and 1b have the same configuration, so the coating processing unit 1a will be described as an example. The coating processing unit 1a includes a spin chuck 12a, which is a substrate holding unit for adhering to and horizontally maintaining a rear central portion of the wafer W, and the spin chuck 12a is connected to a rotation driving mechanism 14a through a rotary shaft 13a. The spin chuck 12a is rotatable around a vertical axis in a state of holding the wafer W through the rotation driving mechanism 14a, and the center of the wafer W is set to be positioned at a rotational axis. The rotation driving mechanism 14a controls a rotational speed of the spin chuck 12a upon receiving a control signal from the controller 7 to be described later.

A cup 21a having an opening 20a provided at an upper side is installed around the spin chuck 12a such that it surrounds the wafer W on the spin chuck 12a, and an upper end portion at a lateral surrounding face of the cup 21a forms a sloped portion 22a sloped inwardly. A liquid accommodation unit 23a having, for example, a concave shape is installed at a lower portion of the cup 21a. The liquid accommodation unit 23a is divided into an outer area and an inner area at a lower side of the entire circumference of the wafer W by a partition wall 24a. A liquid discharge hole 25a is formed at a bottom portion of the outer area in order to discharge a resist stored at the lower portion of the outer area, and exhausts 26a are formed at a bottom portion of the inner area to exhaust a processing atmosphere.

One end portion of an exhaust pipe 27a is connected to the exhausts 26a, and the other end portion of the exhaust pipe 27a is connected to an exhaust path of a plant through an exhaust damper (not shown).

In the drawing, reference numeral 15a denotes a lifting pin, and three lifting pins are installed in the cup 21a (only two lifting pins are illustrated in FIGS. 1 and 3, for the sake of convenience). The lifting pins 15a are lifted by a lifting mechanism 16a to transfer the wafer W between a substrate transfer mechanism (equivalent to a transfer arm A3 in FIG. 10) (not shown) that transfers the wafer W to a resist coating device and the spin chuck 12a.

With respect to the coating processing unit 1b in each drawing, the same numbers as those of the coating processing unit 1a with 'b' instead of 'a' are used for the portions corresponding to the respective portions of the coating processing unit 1a.

Figure 5:
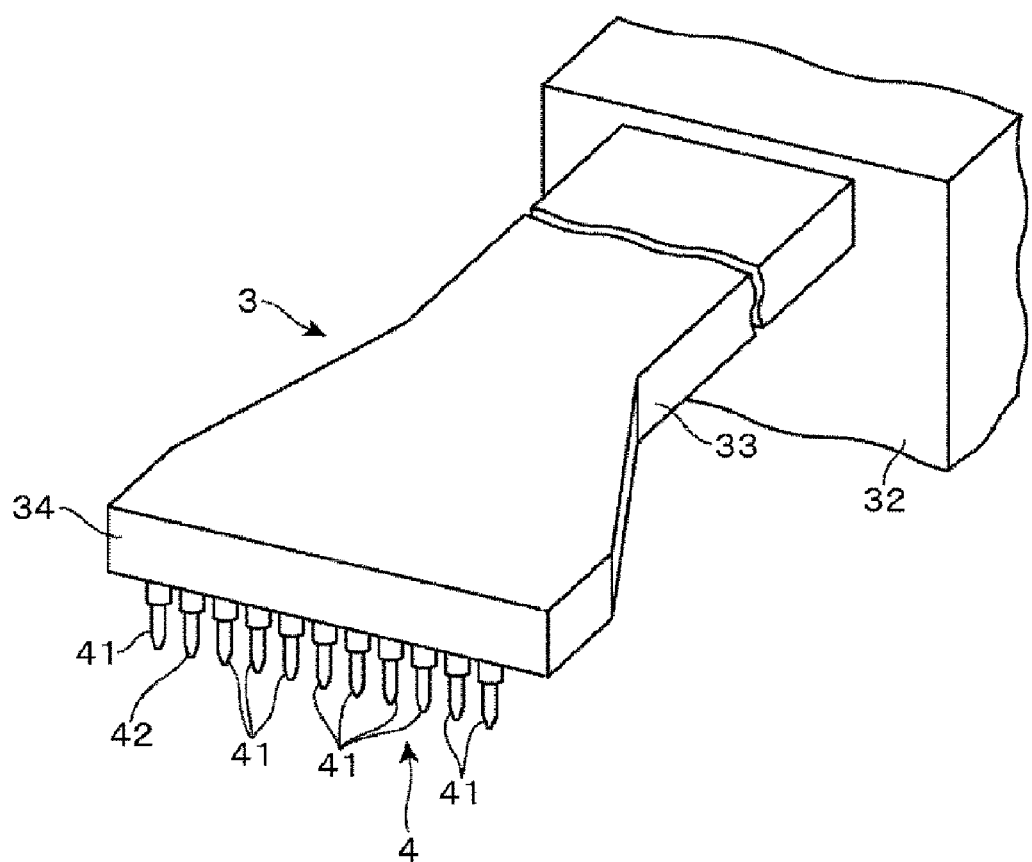
FIG. 5 is a perspective view of a movement mechanism in the resist coating device.

As shown in FIG. 5, the movement mechanism 3 includes a horizontal movement unit 32 guided along a guide 31 extended in a direction (Y direction in FIG. 1) in which the coating processing units 1a and 1b are arranged, and an arm 33 extended horizontally from the horizontal movement unit 32 and simultaneously lifted by the lifting mechanism (not shown) with respect to the horizontal movement unit 32, and a nozzle unit 4 is installed at a front end portion of the arm 33. The nozzle unit 4 includes ten resist discharge nozzles 41, each of which supplies a plurality of types of resists, e.g., ten types of resists, having different concentration rates and components, and a thinner discharge nozzle 42 which supplies a solvent as a processing solution, e.g., a thinner, for facilitating extending of the resist on the wafer W. The thinner discharge nozzle 42 is supported at a lower portion of a nozzle head 34 which forms the front end portion of the arm 33. Respective nozzles 41 and 42 are arranged to be parallel to the movement direction (Y direction in FIG. 1) of the nozzles 41 and 42 by the arm 33. Also, in the present embodiment, the resists and thinner are collectively called the liquid chemical.

The arm 33 is moved in a horizontal direction in a state of being lifted, in order to prevent interference with the respective coating processing units 1a and 1b, the circumferential portion removing mechanism (not shown), and the nozzle bus 5. When a liquid chemical is supplied from the nozzle unit 4 to the wafer W, the arm 33 is moved to a descending position such that a distance between the wafer W and the nozzles 41 and 42 is a predetermined distance, in order to suppress the generation of a mist.

The respective nozzles 41 and 42 have a discharge hole for the liquid chemical opened in a vertical downward direction. The respective nozzles 41 and 42 may be moved onto the central portion of the wafer W according to the movement of the horizontal movement unit 32 in a horizontal direction, and discharge the liquid chemical from each of the discharge holes to the central portion of the wafer W rotating around the vertical axis. The discharged liquid chemical is expanded to a circumferential portion of the wafer W by the centrifugal force, and coated on the entire surface of the wafer W through so-called spin coating.

Figure 4:
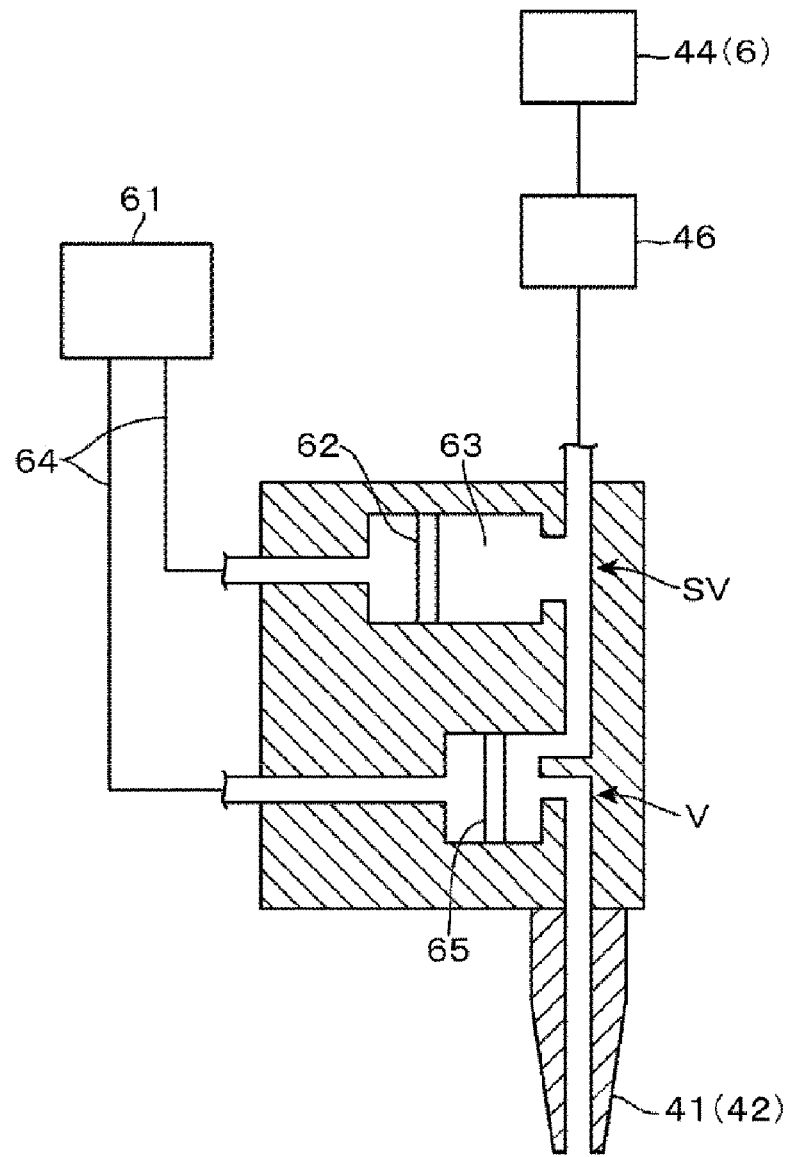
FIG. 4 is a vertical side view of a nozzle head in the resist coating device.

In FIG. 3, reference numeral 43 denotes a liquid chemical supply unit. The liquid chemical supply unit 43 includes a tank in which a liquid chemical to be supplied to the respective nozzles 41 and 42 is stored, a resist supply mechanism 44 including a delivery mechanism for pressurizing the interior of the tank and delivering the liquid chemical from the tank to the nozzles, and a thinner supply mechanism 6. Also, ten resist supply mechanisms 44, as many as the nozzles 41, are installed. In the drawing, reference numeral 45 denotes a liquid chemical supply line connecting the nozzles 41 and 42 and each of the resist supply mechanisms 44, and a flow rate controller 47 including a valve 46 is interposed and installed at each of the liquid chemical supply lines 45. Switching of the respective valves 46 is controlled upon receiving a control signal from the controller 7, and ten types of resists and the thinner are changed to be supplied to the wafer W. Also, as shown in FIG. 4, a discharge valve V and a suck back valve (SV) are installed in series in this order from a discharge side within the nozzle head 34 (see FIG. 3) at a primary side of each of the nozzles 41 and 42. These valves V and SV are operated by using air pressure as power by an air pressure control mechanism 61. The discharge valve V opens and closes a flow path between the respective liquid chemical supply lines 45 and the respective nozzles 41 and 42 by air pressure. The suck back valve SV includes a liquid chemical suction space 63, and the capacity and a liquid chemical pressure of the liquid chemical suction space 63 can be adjusted by a piston mechanism operated by air pressure. Reference numerals 62 and 65 in FIG. 4 denote a valve body of the suck back valve SV and the discharge valve V, respectively, and reference numeral 64 denotes a pipe for allowing air to flow therethrough between the air pressure control mechanism 61 and the suck back valve SV and the discharge valve V.

Figure 6:
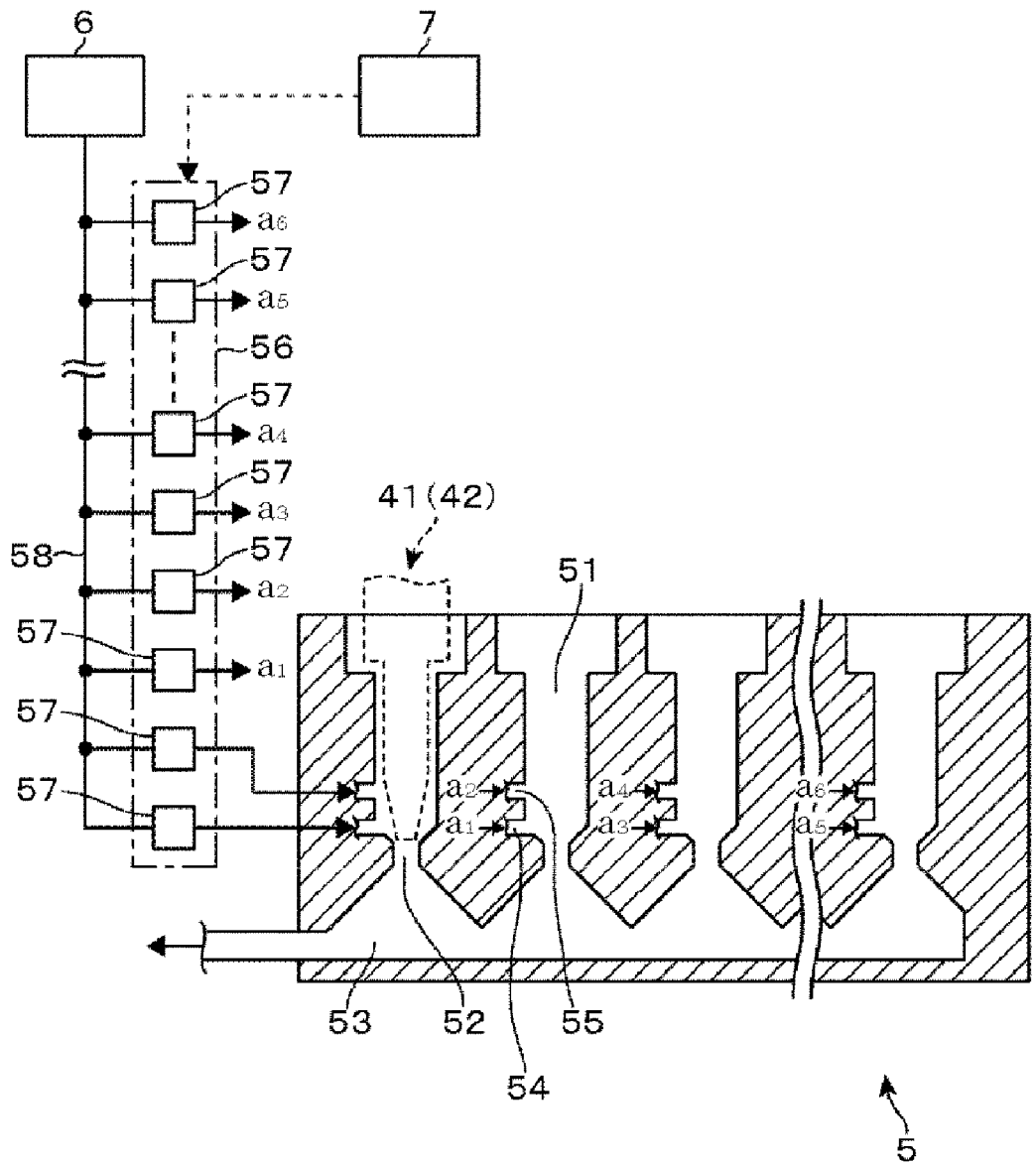
FIG. 6 is a sectional view of a nozzle bus of the movement mechanism.

As shown in FIGS. 1 and 2, the nozzle bus 5 is installed on the base 2 in a standby area, which is one end portion of the path along which the nozzle unit 4 horizontally moves (Y direction in FIG. 2). As shown in FIG. 6, eleven cleansing chambers 51 (the number of chambers equals the number of nozzles in this embodiment) having a container-like shape in which the respective nozzles 41 and 42 are individually received are installed. A lower portion of the cleaning chambers 51 has a funnel-like shape, and a lower end portion thereof communicates with a liquid discharge chamber 53 which is common for each of the cleansing chambers 51 through openings 52. The openings 52 have an area large enough to allow the thinner to be stored in the cleansing chambers 51 depending on the amount of thinner the needs to be supplied.

The liquid introduced into the liquid discharge chamber 53 is drained outside of the resist coating device by natural flow descent through a drain pipe (not shown). Also, a thinner supply member 54 is formed at a side wall of a lower portion of the funnel-like shape of each of the cleansing members 51, and a thinner supply member 55 is formed at a portion of the container-like shape which is a slightly upper portion of the funnel-like shaped portion. As shown in FIG. 6, the thinner supply members 54 and 55 are connected to the thinner supply mechanism 6 through pipes 58 at each of the cleansing members 51. A thinner supply controller 56 including valves 57 corresponding to the respective thinner supply members 54 and 55 are interposed and installed in the pipes 58. The thinner supply controller 56 controls a switching operation of the respective valves 57 in response to a control signal from the controller 7, and adjusts the amount of thinner supply in each of the cleansing chambers 51 and the thinner supply members 54 and 55. The nozzle unit 4 is received and remains in the nozzle bus 5 when it does not perform processing on the wafer W.

Figure 7:
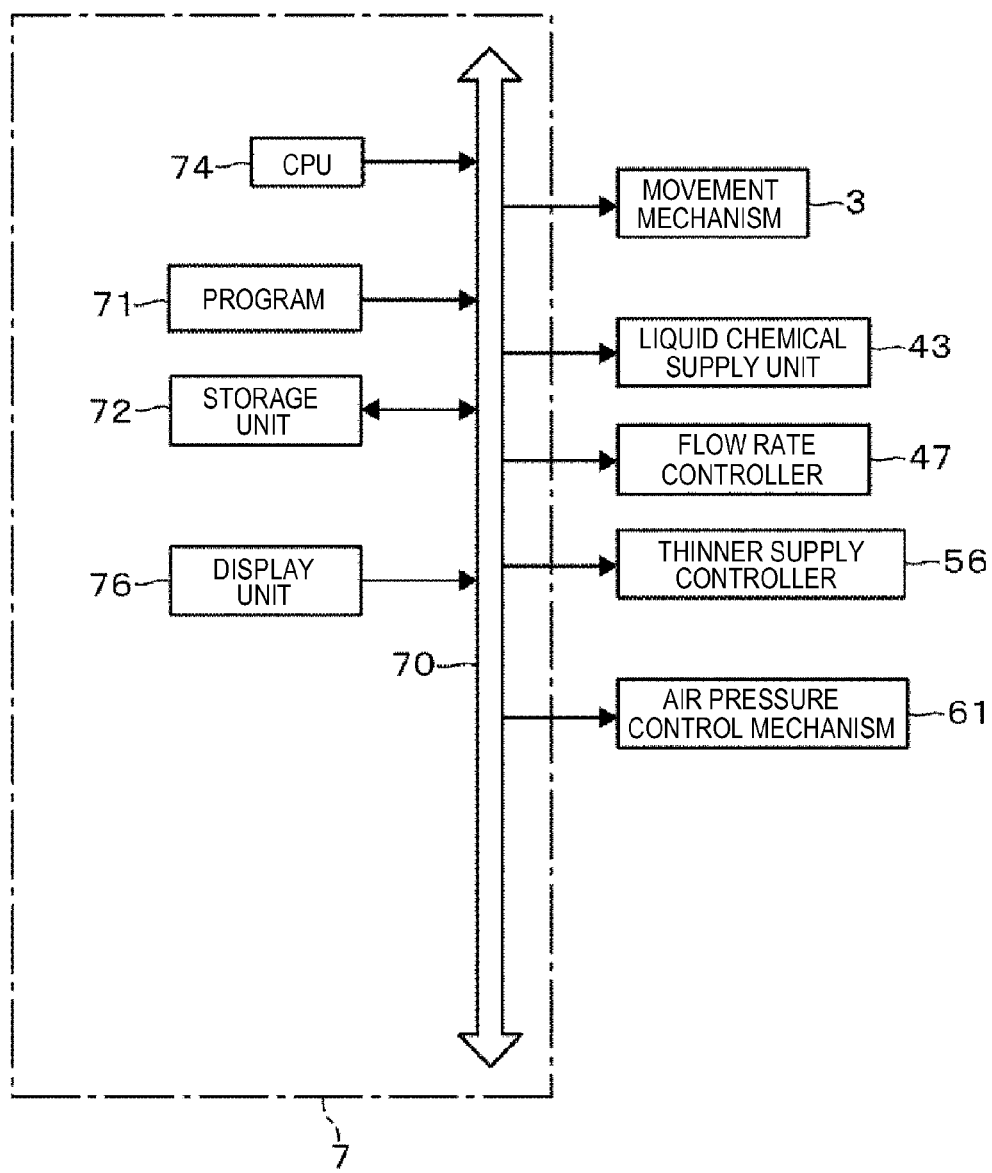
FIG. 7 is a view showing the configuration of a controller of the resist coating device.

As shown in FIG. 7, a controller 7, e.g., a computer, is installed in the resist coating device. The controller 7 includes a bus 70, a program 71, a storage unit 72, a CPU 74, a manipulation unit 75, and a display unit 76. The display unit 76 may be configured as, for example, a display. The program 71 may be stored in, for example, a program storage unit configured by a computer storage medium such as a flexible disk, a compact disk, a hard disk, an MO (magneto-optical disk), a memory card and the like, and installed in the controller 7. Also, in FIG. 7, the program storage unit is omitted for the sake of convenience.

For example, a processing recipe of the wafer W loaded into the resist coating device is sent from an upper computer for controlling the transfer of the wafer W to the controller 7, and stored in the storage unit 72. When the CPU 74 executes each command of the program 71, the processing recipe stored in the storage unit 72 is read, and a control signal is sent to each part of the resist coating device depending on the processing recipe. Also, the operation of the program 71 includes an operation regarding a display on the display unit 76 or the like.

Said horizontal movement unit 32, liquid chemical supply unit 43, flow controller 57, thinner supply controller 56, and the like are connected to the bus 70, and the resist coating process on the wafer W may be performed.

Figure 8:
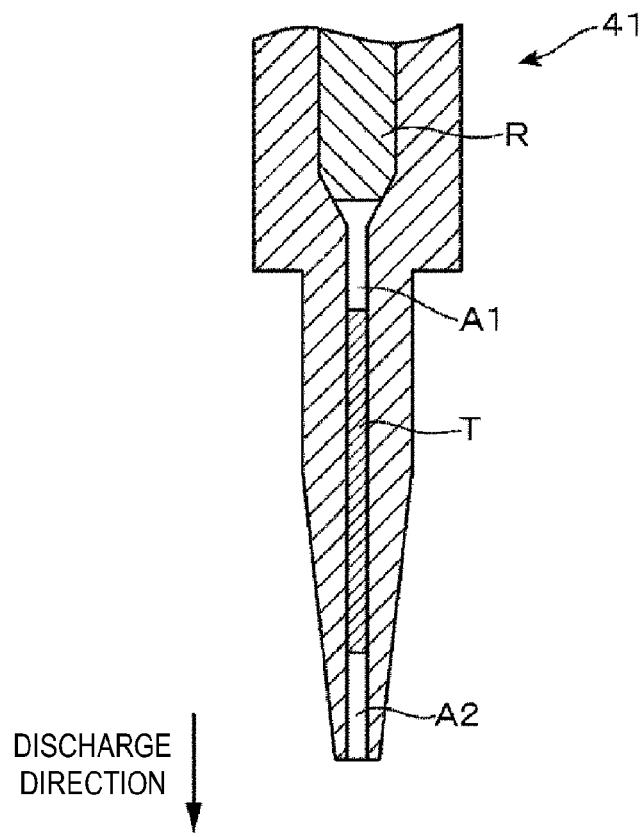
FIG. 8 is a sectional view of a resist discharge nozzle of the movement mechanism in forming a layer structure.

Here, before explaining the operation of the resist coating method according to this embodiment, a layer structure formed at a front end portion of the resist discharge nozzle 41 in standby mode according to the present disclosure will be described. In this embodiment, since the plurality of resist discharge nozzles 41 are supported by the common arm 33, nozzles 41 other than nozzles 41 in use are in standby mode regardless of coating processing in the interim. Thus, when a resist solution in the nozzle 41 is in contact with air, the solvent in the resist solution within the nozzle 41 would be volatilized in the air, solidifying the resist solution or changing the concentration of the resist solution to result in defective coating. As a solution, after the use of the nozzle 41, the atmosphere, e.g., air, within the resist coating device, and the solvent, e.g., the thinner solution, are absorbed to form a layer structure such that a thinner layer T is interposed between two air layers A1 and A2 at a front end portion of the nozzle 41 as shown in FIG. 8, thus restraining the resist solution R within the nozzle 41 from being in contact with the air.

Now, a liquid chemical discharge process and an absorption process by each of the nozzles 41 and 42 according to this embodiment will be described. The liquid chemical discharge process by the nozzles 41 and 42 include a pressure settlement step and a discharge step. In the pressure settlement step, in a state where a certain amount of liquid chemical is filled in the liquid chemical absorption space 63 of the suck back valve SV so that the discharge valve V and the valve 46 are closed, the pressure within the liquid chemical absorption space 63 is adjusted to have a certain value by the air pressure control mechanism 61. In the discharge step, the discharge valve V is opened in a state where the pressure settlement is completed, to discharge a certain amount of liquid chemical to the wafer W. Meanwhile, in the liquid chemical absorption process, after the liquid chemical is discharged, the discharge valve V is closed and the valve 46 is opened, and in this state, the valve body 62 of the suck back valve SV is operated in a direction in which the capacity of the liquid chemical space 63 is increased, thus absorbing the liquid chemical into the liquid chemical absorption space 63 from the resist supply mechanism 44 and the thinner supply mechanism 6. Besides, the air and thinner absorption in the formation of the layer structure according to this embodiment is made by operating the valve body 62 of the suck back valve SV in a direction in which the capacity of the liquid chemical absorption space 63 is increased in a state where the discharge valve V is opened and the valve 46 is closed, in a converse manner of the absorption. These operations are performed by a control signal from the controller 7.

Next, the operation of this embodiment will be described. The operation of this embodiment features a manipulation related to the nozzle 41 in changing a lot, and first, a process performed on the wafer W within the coating processing unit 1a (1b) will be described. The process performed hereinafter is executed based on the program 71 stored in the program storage unit. The wafer W transferred to, for example, the coating processing unit 1a by an external substrate transfer mechanism of the resist coating device is transferred to the spin chuck 12a through the lifting pin 15a. Thereafter, the nozzle unit 4 in standby mode in the nozzle bus 5 is lifted through the arm 33 and moved in the Y direction, and after the thinner discharge nozzle 42 is positioned on a central portion of the wafer W, the arm 33 descends. For example, keeping pace with the movement operation of the arm 33, the spin chuck 12a is rotated, and a thinner is supplied onto the wafer W being rotated. After the thinner is spin-coated, the arm 33 is moved in the Y direction such that the resist discharge nozzle 41 used in the process can be positioned on the central portion of the wafer W. According to this movement operation, the number of rotations of the wafer W is increased, and the resist is supplied onto the wafer W and coated on the entire surface of the wafer W through spin coating.

After the supply of the resist is stopped, the number of rotations of the wafer W with the resist R coated thereon is reduced to make the thickness of the resist uniform, and the number of rotations is again continuously increased to "shake-off dry" the coated resist to form a resist film. The resist film coated on a circumferential portion of the "shake-off dry" completed wafer W is removed by said circumferential portion coating film removing mechanism (not shown), thus completing sequential liquid processing. And then, the wafer W is transferred to the external substrate transfer mechanism of the resist coating device through the lifting pin 15a and thus unloaded from the resist coating device.

Figure 9A:
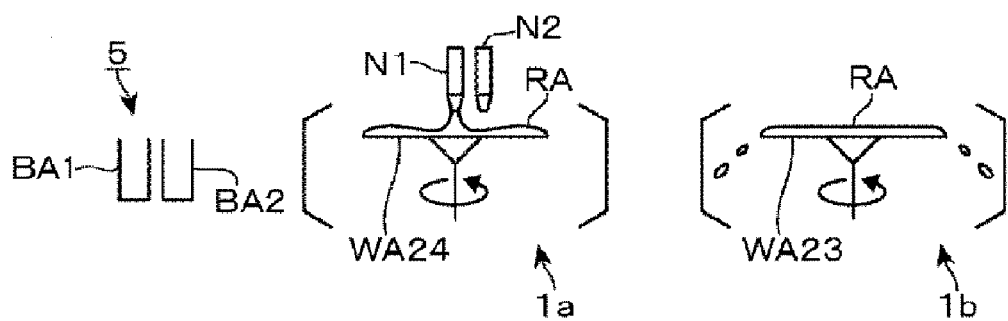
FIGS. 9A to 9G are a vertical side view illustrating an operational outline of the resist discharge nozzle in changing a lot of a wafer, respectively.
Figure 9B:
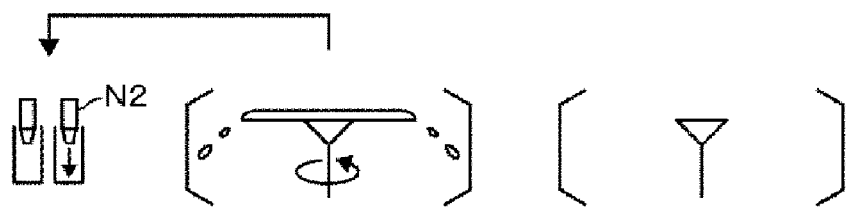

A process in changing a lot of the wafer W according to the present disclosure will be described with reference to FIGS. 9 and 10. In the following description, the processing performed on the wafer W in the coating processing unit 1a (1b) is simplified. It is assumed that, currently, a resist solution RA for a preceding lot is supplied from a nozzle N1 for a preceding lot (from one of the resist discharge nozzles 41), to a wafer WA24 which is the second last wafer of the preceding lot A in the first coating processing unit 1a. In the interim, shake-off drying is performed on a third wafer WA23 from the last of the preceding lot A in the second coating processing unit 1b (FIG. 9A). When supplying the resist solution RA to the wafer WA24 is finished, the nozzle unit 4 including the nozzle N1 is returned to the standby area. And, a nozzle N2, a resist discharge nozzle 41 for a following lot B discharges a thinner having the foregoing layer structure to the standby bus BA2 which is a cleansing chamber 51 for the nozzle N2, and in a state where a final wafer WA25 of the preceding lot A remains to be processed, coating processing of the following lot B is provided. In the interim, in the first coating processing unit 1a, the wafer WA24 enters the shake-up drying process, and during the shake-up drying process, the second coating processing unit 1b unloads the third wafer WA23 from the last of the preceding lot A and subsequently loads the last wafer WA25 of the preceding lot A (FIG. 9B). Also, the substrate transfer mechanism circulates between the modules in charge within a processing block during a preset cycle time, and accordingly, the wafers W are alternately loaded into the coating processing unit 1a (1b) at the interval of the cycle time (wafers W are replaced).

Figure 9C:
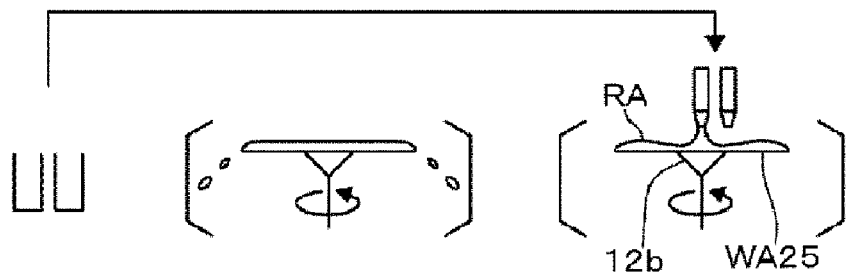
Figure 9D:
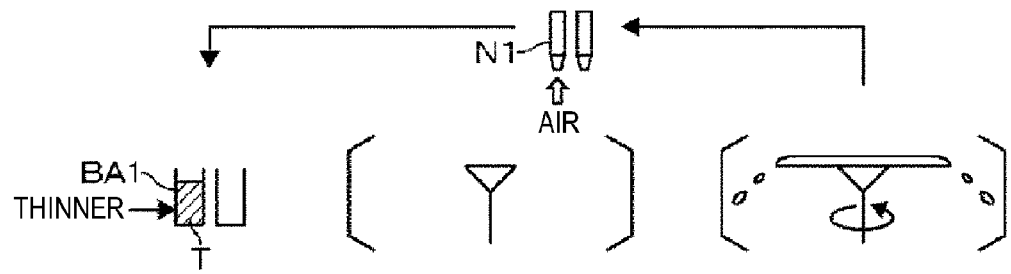
Figure 10:
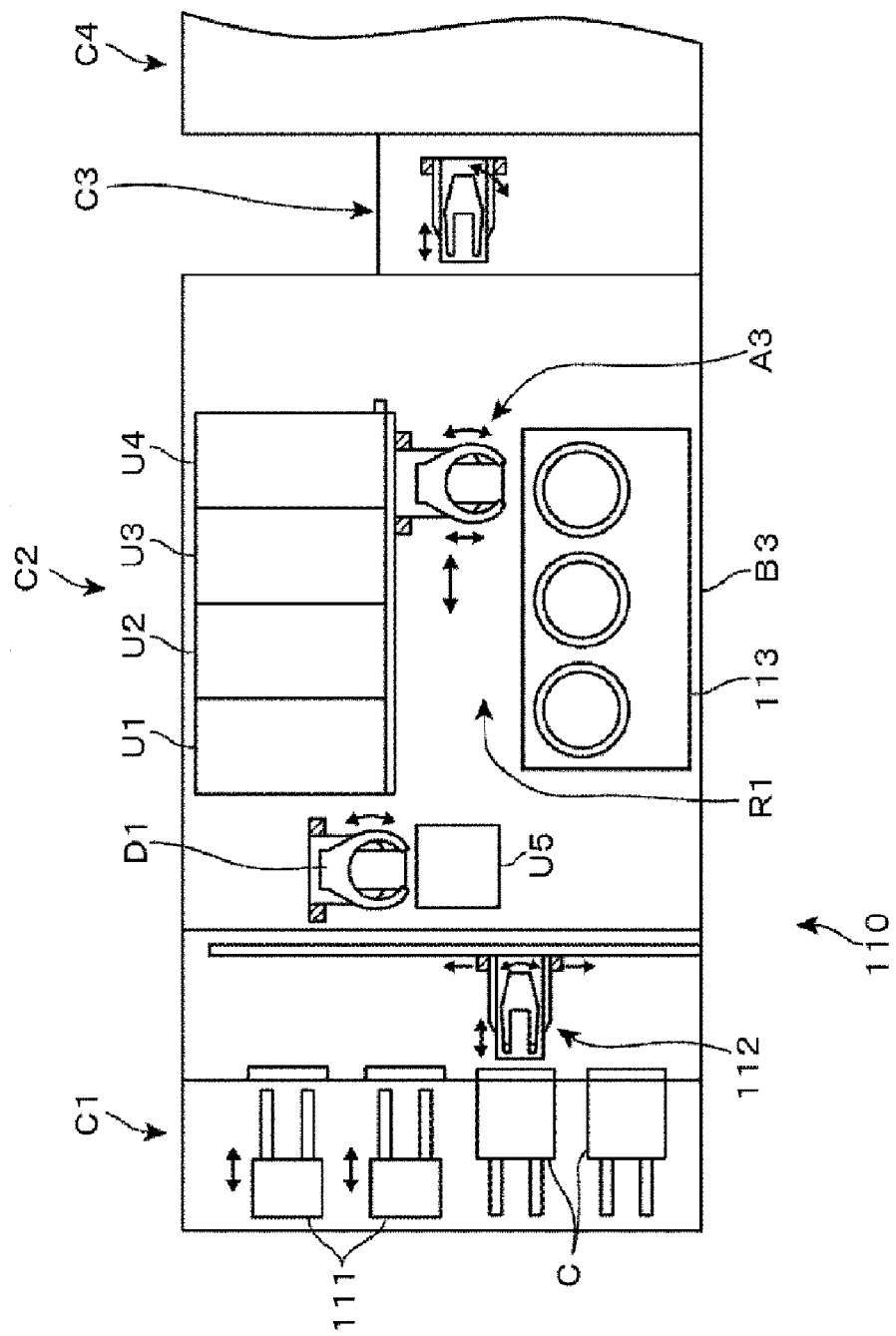
FIG. 10 is a plan view of a coating/developing device having the resist coating device.

When the last wafer WA25 of the preceding lot A is transferred to the spin chuck 12b of the second coating processing unit 1b, the nozzle unit 4 may be moved onto the second coating processing unit 1b and resist RA is supplied from the nozzle N1 to the wafer WA25 (FIG. 9C). When the supply of the resist solution RA to the wafer WA25 is completed, the nozzle unit 4 is moved to the nozzle bus 5. Here, while being moved to the nozzle bus 5, the nozzle N1 absorbs atmosphere, e.g., air, within the resist coating device, forming a first air layer at the front end portion within the nozzle N1. Also, in the nozzle bus 5, the thinner T has been supplied from the thinner supply mechanism 6 and stored in the standby bus BA1, the cleansing chamber 51 for the nozzle N1 during the movement of the nozzle unit 4. In the interim, the wafer WA24 is unloaded from the first coating processing unit 1a, and shake-off drying is performed on the wafer WA25 in the second coating processing unit 1b (FIG. 9D).

Figure 9E:
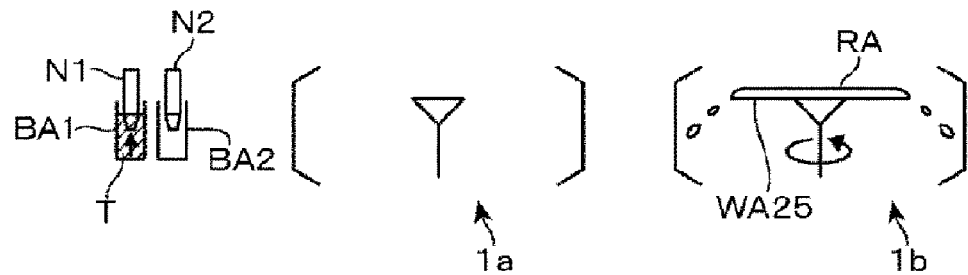
Figure 9F:
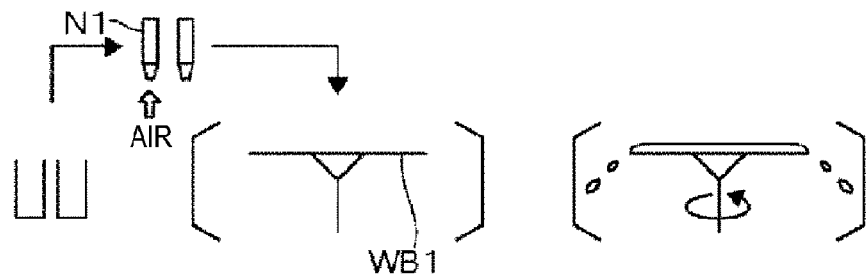
Figure 9G:
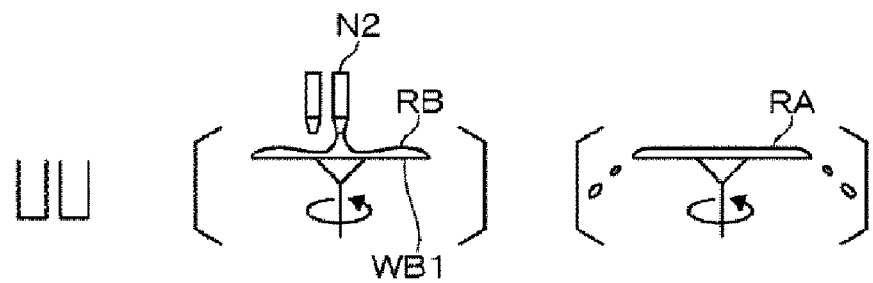

In the nozzle unit 4 which has been returned to the nozzle bus 5, the nozzle N1 in which the first air layer is formed absorbs the thinner T stored in the standby bus BA1 to form the thinner layer T (FIG. 9E). And, after a first wafer WB1 of the following lot B is loaded in the first coating processing unit 1a, the nozzle unit 4 moves onto the first coating processing unit 1a. During this movement, the nozzle N1 absorbs atmosphere, e.g., air, within the resist coating device, whereby the second air layer A2 is formed at the front end portion in the nozzle N1, and thus, the formation of the foregoing layer structure in the nozzle N1 is completed (FIG. 9F). Thereafter, in the first coating processing unit 1a, the resist solution RB for a following lot is supplied to the first wafer WB1 of the following lot B by the nozzle N2, the resist discharge nozzle 41 for the following lot B (FIG. 9G). Then, as mentioned above, the wafer WB of the following lot B are alternately transferred to the first coating processing unit 1a and the second coating processing unit 1b, and the nozzle N2 reciprocally moves between both coating processing units 1a and 1b and the standby bus BA2 to supply the resist solution RB to the wafer WB, thus performing coating processing.

In the foregoing embodiment, the following is devised for the resist coating device having the layer structure in which the resist discharge nozzle 41 (nozzle N1 in FIGS. 9A to 9G) for the preceding lot A and the resist discharge nozzle 41 (nozzle N2 in FIGS. 9A to 9G) for the following lot B are integrated by the common movement mechanism 3 to be moved between the upper portions of the coating processing units 1a and 1b and the nozzle bus 5 in a standby area, and the thinner layer T interposed between the first and second air layers A1 and A2 at the front end portion of the resist discharge nozzle 41 not in use. Namely, after the resist solution RA is supplied from the resist discharge nozzle (nozzle N1) for the preceding lot A to the last wafer WA25 of the preceding lot A, the resist discharge nozzle 41 for the preceding lot A is moved to the nozzle bus 5 and air, a gas of atmosphere, is sucked into the resist discharge nozzle 41 (nozzle N1) for the preceding lot A to form the first air layer A1 within the nozzle 41 (nozzle N1). Also, as the resist discharge nozzle 41 (nozzle N2) for the following lot B is moved to an upper portion of the front wafer WB of the following lot B, air, a gas of the atmosphere, is sucked into the resist discharge nozzle 41 (nozzle N2) of the preceding lot B to from the second air layer A2 within the nozzle 41 (nozzle N2). Accordingly, even when the operation of forming the layer structure at the front end portion of the muzzle 41 (nozzle N1) is performed after the process of the resist discharge nozzle 41 (nozzle 41) for the preceding lot A is completed, the processing of the wafer WB of the following lot B can be quickly performed without causing unnecessary standby time.

Also, in the foregoing embodiment, the processes of forming both the first and second air layers A1 and A2 are performed along with the process of moving the nozzle unit 4, but even when only one of the processes of forming the air layers is performed along with the process of moving the nozzle unit 4, the unnecessary standby time can be shortened and the processing of the wafer WB of the following lot 5 can be quickly initiated.

Further, in the foregoing embodiment, the nozzle unit 4 is first moved to the nozzle bus 5 between the process of supplying the resist RA to the second wafer WA24 from the last of the preceding lot A and the process of supplying the resist RA to the last wafer WA25, and the thinner T forming the layer structure is discharged by the resist discharge nozzle 41 (nozzle N2) for the following lot B. Also, after the resist RA is supplied to the wafer WA25 and before the nozzle unit 4 arrives at the nozzle bus 5, the thinner T is already stored in the standby bus BA1, which is the cleansing chamber 51, for the resist discharge nozzle 41 (nozzle N1) for the preceding lot A. Thus, an operation performed by the nozzle unit 41 between the process of supplying the resist RA to the wafer WA25 and the process of supplying the resist RB to the first wafer WB of the following lot B is simplified, further reducing a generation of unnecessary standby time.

In some embodiments, the process of moving the nozzle N1 for the preceding lot A along with the nozzle N2 for the following lot B to the nozzle bus 5 may be performed along with the process of sucking air into the nozzle N1 for the preceding lot A to form the first air layer A1 within the nozzle N1, but in this case, a timing at which the air sucking is terminated may come after the nozzle N1 for the preceding lot A arrives at the nozzle bus 5.

Also, in performing the process of forming the second air layer A2 within the nozzle N1 for the preceding lot A, the process of moving the nozzle N2 for the following lot B to an upper side of the first wafer WB1 of the following lot B from the nozzle bus 5 along with the nozzle N1 for the preceding lot A may be performed together, or a portion of the process may be performed together. In this case, the air sucking can be initiated at the nozzle N1 for the preceding lot A, for example, when the corresponding nozzle N1 is in standby mode in the standby bus BA1. Also, the air sucking may be terminated at the nozzle N1 for the preceding lot A even after the nozzle N2 for the following lot B is moved to an upper side of the first wafer WB1 of the following lot B.

In the foregoing embodiment, a case where two coating processing units 1a and 1b are installed in a single resist coating device has been described, but the present disclosure is not limited thereto and may also be applicable to a resist coating device having three or more coating processing units.

Hereinafter, the foregoing resist coating device incorporated in a coating/developing device 110 will be described. FIG. 10 shows a plan view of a resist pattern forming system in which an exposing device C4 is connected to the coating/developing device 110, and FIG. 11 is a perspective view of the system. A carrier block C1 is installed in the coating/developing device 110, and a transfer arm 112 extracts the wafer W from an air-tight carrier C loaded on a loading table 111 and transfers the same to a processing block C2, and then, the transfer arm 112 receives the wafer W which has been completely processed from the processing block C2 and returns it to the carrier C. A plurality of sheets of wafers W of the same lot are received in the carrier C, and each of the wafers W is sequentially transferred to the processing block C2.

As shown in FIG. 11, in this example, the processing block C2 includes a first block (DEV layer) B1 for developing, a second block (BCT layer) B2 for forming an anti-reflective film under a resist film, a third block (COT layer) B3 for coating the resist film, and a fourth block (ITC layer) B4 for forming an anti-reflective film on the resist film, which are sequentially stacked from the lower side.

Each layer of the processing block C2 is configured to be the same when viewed from the top. Here, the third block (COT) layer B3 will be described as an example. The COT layer B3 includes a resist coating module 113 for forming a resist film as a coating film, shelf units U1 to U4 constituting a group of processing modules of a heating system and a cooling system for performing pre-processing and post-processing by the resist coating module 113, and a transfer arm A3 installed between the resist coating module 113 and the shelf units U1 to U4 constituting the heating system and the cooling system and transferring the wafer W therebetween. The resist coating module 113 corresponds to the foregoing resist coating device, and the transfer arm A3 corresponds to the foregoing substrate transfer mechanism.

The shelf units U1 to U4 are arranged along a transfer region R1 in which the transfer arm A3 moves, and is configured by stacking the heating module and the cooling module, respectively. The heating module includes a heating plate for heating the loaded wafer, and the cooling module includes a cooling plate for cooling the loaded wafer. Also, a shelf unit U5 is installed at the processing block C2 as shown in FIG. 10. The shelf unit U5 mediates a transmission of the wafer W between the carrier block C1 and the respective block layers B1 to B4 of the processing block C2. Further, D1 is a transfer arm for transferring the wafer W between respective units in the shelf unit U5.

The wafer W loaded in the coating/developing device 110 is transferred to the shelf unit U5 by way of the carrier block C1. And, after an anti-reflective film is formed on the BCT layer B2, the wafer W is returned to the shelf unit U5. From there, the wafer W is loaded to the resist coating module 113 by the transfer arm A3, directly or by way of the shelf units U1 to U4, and coated with a resist. The coated wafer W is returned to the shelf unit U5 by the transfer arm A3. Thereafter, the wafer W is subjected to processing procedures such as formation of anti-reflective film, exposure, development, and the like, and then unloaded to the outer side of the carrier block C1. Also, C3 is an interface block for mediating the transmission of the wafer W between the coating/developing device 110 and an exposing device C4.

In the foregoing example, the coating device according to the present disclosure is configured as the resist coating device, but for example, the coating device may be configured as an anti-reflective film formation module installed in the coating/developing device 110 to discharge a liquid chemical corresponding to each module, instead of the resist, or a liquid chemical including a precursor material for forming an insulating film formed of a silicon oxide film.

According to the present disclosure in some embodiments, it is possible to provide a coating device in which the nozzle for a preceding lot and the nozzle for a following lot are integrated by a common movement mechanism and move between an upper side of a liquid processing unit and a standby area, and a layer structure including a solvent layer interposed between gas (e.g., air) layers is formed at a front end portion of the nozzle not in use. Further, in an embodiment of the present disclosure, after a coating liquid is supplied from the nozzle for the preceding lot to the last substrate of the preceding lot, the nozzle for the preceding nozzle is moved to the standby area and a gas of atmosphere is sucked into the nozzle for the preceding lot to form the upper gas layer within the nozzle. Also, in another embodiment of the present disclosure, when the nozzle for the following lot is moved to an upper side of the front substrate of the following lot, the gas of atmosphere is sucked to the nozzle of the preceding lot to form the lower gas layer within the nozzle. Thus, although the layer structure is formed at the front end portion of the nozzle after the role of the nozzle for the preceding lot is terminated, the substrate of the following lot can be quickly processed.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A coating method for forming a coating film by supplying a coating liquid obtained by dissolving a component of a coating film in a solvent from a nozzle to a substrate, wherein a device is configured such that a nozzle for a preceding lot and a nozzle for a following lot are integrated into a common movement mechanism and moved between an upper side of a liquid processing unit and a standby area, the device including a first valve for controlling supply of a coating liquid and third and second valves installed in series in this order from a discharge side within a nozzle head for each nozzle, wherein the second valve includes a predetermined space, the coating method comprising:
- decreasing, when a certain amount of coating liquid is filled in the predetermined space of the second valve through the first valve, a capacity of the predetermined space while closing the first and third valves, and then opening the third valve to discharge the coating liquid for supplying the coating liquid from the nozzle for the preceding lot to a last substrate of the preceding lot loaded in a first liquid processing unit;
- moving the nozzle for the preceding lot along with the nozzle for the following lot to the standby area;
- increasing the capacity of the predetermined space of the second valve while closing the first valve and opening the third valve for sucking air into the nozzle for the preceding lot to form an upper gas layer within the nozzle, simultaneously with the moving the nozzle for the preceding lot to the standby area;
- increasing the capacity of the predetermined space of the second valve while closing the first valve and opening the third valve for sucking a solvent into the nozzle for the preceding lot in the standby area;
- after a front substrate of the following lot is loaded to a second liquid processing unit different from the first liquid processing unit, moving the nozzle for the following lot along with the nozzle for the preceding lot to an upper side of a front substrate of the following lot;
- increasing the capacity of the predetermined space of the second valve while closing the first valve and opening the third valve for sucking gas of atmosphere into the nozzle for the preceding lot while simultaneously moving the nozzle for the following lot to the upper side of the front substrate of the following lot to form a lower gas layer within the nozzle so that a solvent layer is interposed between the upper gas layer and the lower gas layer; and
- decreasing, when a certain amount of coating liquid is filled therein through the first valve, a capacity of the predetermined space of the second valve while closing the first and third valves, and then opening the third valve to discharge the coating liquid for supplying the coating liquid to the front substrate of the following lot from the nozzle for the following lot.

2. The coating method of claim 1, wherein, the solvent is stored in the standby area of the nozzle for the preceding lot.

3. The coating method of claim 1, wherein solvent is discharged from the nozzle for the following lot in the standby area when the nozzle for the preceding lot is returned to the standby area.

4. A coating method for forming a coating film by supplying a coating liquid obtained by dissolving a component of a coating film in a solvent from a nozzle to a substrate, wherein a device is configured such that a nozzle for a preceding lot and a nozzle for a following lot are integrated into a common movement mechanism and moved between an upper side of a liquid processing unit and a standby area, the device including a first valve for controlling supply of a coating liquid, and third and second valves installed in series in this order from a discharge side within a nozzle head per the respective nozzles, wherein the second valve includes a predetermined space, the coating method comprising:
- decreasing, when a certain amount of coating liquid is filled in the predetermined space of the second valve through the first valve, a capacity of the predetermined space while closing the first and third valves, and then opening the third valve to discharge the coating liquid for supplying the coating liquid from the nozzle for the preceding lot to the last substrate of the preceding lot loaded in a first liquid processing unit;
- moving the nozzle for the preceding lot along with the nozzle for the following lot to the standby area;
- after supplying a coating liquid, increasing the capacity of the predetermined space of the second valve while closing the first valve and opening the third valve for sucking air into the nozzle for the preceding lot to form an upper gas layer within the nozzle;
- increasing the capacity of the predetermined space of the second valve while closing the first valve and opening the third valve for sucking a solvent into the nozzle for the preceding lot in the standby area;
- after a front substrate of the following lot is loaded to a second liquid processing unit different from the first liquid processing unit, moving the nozzle for the following lot along with the nozzle for the preceding lot from the standby area to an upper side of the front substrate of the following lot;
- increasing the capacity of the predetermined space of the second valve while closing the first valve and opening the third valve for sucking air into the nozzle for the preceding lot simultaneously with said moving the nozzle for the following lot to form a lower gas layer within the nozzle, and forming a state that a solvent layer is interposed between the upper gas layer and the lower gas layer; and
- after the nozzle for the following lot is moved to the upper side of the front substrate of the following lot, decreasing, when a certain amount of coating liquid is filled in the predetermined space of the second valve through the first valve, a capacity of the predetermined space while closing the first and third valves, and then opening the third valve to discharge the coating liquid for supplying a coating liquid to the corresponding substrate from the nozzle for the following lot.

5. A method for controlling a coating device through a controller, the coating device for forming a coating film by supplying a coating liquid obtained by dissolving a component of a coating film in a solvent from a nozzle to a substrate kept in a liquid processing unit, the coating device including first and second liquid processing units; and a movement mechanism configured such that a nozzle for a preceding lot and a nozzle for a following lot are integrated and moved between an upper side of the first liquid processing unit and a standby area; and the controller configured to control the operations of the nozzle for the preceding lot and the nozzle for the following lot, wherein the controller has a program that causes the following method to be executed, and the coating device includes a first valve for controlling supply of a coating liquid, and third and second valves installed in series in this order from a discharge side within a nozzle head per the respective nozzles, wherein the second valve includes a predetermined space, the method comprising:
- decreasing, when a certain amount of coating liquid is filled in the predetermined space of the second valve through the first valve, a capacity of the predetermined space while closing the first and third valves, and then opening the third valve to discharge the coating liquid for supplying the coating liquid from the nozzle for the preceding lot to the last substrate of the preceding lot loaded in the first liquid processing unit;
- moving the nozzle for the preceding lot along with the nozzle for the following lot to the standby area;

after supplying a coating liquid, increasing the capacity of the predetermined space of the second valve while closing the first valve and opening the third valve for sucking air into the nozzle for the preceding lot to form an upper gas layer within the nozzle;

increasing the capacity of the predetermined space of the second valve while closing the first valve and opening the third valve for sucking a solvent into the nozzle for the preceding lot in the standby area;

after a front substrate of the following lot is loaded to a second liquid processing unit different from the first liquid processing unit, moving the nozzle for the following lot along with the nozzle for the preceding lot from the standby area to an upper side of the front substrate of the following lot;

increasing the capacity of the predetermined space of the second valve while closing the first valve and opening the third valve for sucking air into the nozzle for the preceding lot simultaneously with moving the nozzle for the following lot to form a lower gas layer within the nozzle, and forming a state that a solvent layer is interposed between the upper gas layer and the lower gas layer; and after the nozzle for the following lot is moved to the upper side of the front substrate of the following lot, decreasing, when a certain amount of coating liquid is filled in the predetermined space of the second valve through the first valve, a capacity of the predetermined space while closing the first and third valves, and then opening the third valve to discharge the coating liquid for supplying the coating liquid to a corresponding substrate from the nozzle for the following lot.

6. The method of claim 5, further comprising storing solvent in the standby area of the nozzle for the preceding lot.

7. The method of claim 5, further comprising discharging solvent from the nozzle for the following lot in the standby area when the nozzle for the preceding lot is returned to the standby area.

8. A coating method for forming a coating film by supplying a coating liquid obtained by dissolving a component of a coating film in a solvent from a nozzle to a substrate, wherein a device is configured such that a nozzle for a preceding lot and a nozzle for a following lot are integrated into a common movement mechanism and moved between an upper side of a liquid processing unit and a standby area, the device including a first valve for controlling supply of a coating liquid, and third and second valves installed in series in this order from a discharge side within a nozzle head for each nozzle, wherein the second valve includes a predetermined space, the coating method comprising:

decreasing, when a certain amount of coating liquid is filled in the predetermined space of the second valve through the first valve, a capacity of the predetermined space while closing the first and third valves, and then opening the third valve to discharge the coating liquid for supplying the coating liquid from the nozzle for the preceding lot to a last substrate of the preceding lot loaded in a first liquid processing unit;

moving the nozzle for the preceding lot along with the nozzle for the following lot to the standby area;

increasing the capacity of the predetermined space of the second valve while closing the first valve and opening the third valve for sucking air into the nozzle for the preceding lot to form an upper gas layer within the nozzle, simultaneously with the moving the nozzle for the preceding lot to the standby area;

increasing the capacity of the predetermined space of the second valve while closing the first valve and opening the third valve for sucking a solvent into the nozzle for the preceding lot in the standby area;

after a front substrate of the following lot is loaded to a second liquid processing unit different from the first liquid processing unit, moving the nozzle for the following lot along with the nozzle for the preceding lot to an upper side of a front substrate of the following lot;

increasing the capacity of the predetermined space of the second valve while closing the first valve and opening the third valve for sucking gas of atmosphere into the nozzle for the preceding lot while simultaneously moving the nozzle for the following lot to the upper side of the front substrate of the following lot to form a lower gas layer within the nozzle so that a solvent layer is interposed between the upper gas layer and the lower gas layer; and decreasing, when a certain amount of coating liquid is filled therein through the first valve, a capacity of the predetermined space of the second valve while closing the first and third valves, and then opening the third valve to discharge the coating liquid for supplying the coating liquid to the front substrate of the following lot from the nozzle for the following lot, wherein solvent is discharged from the nozzle for the following lot in the standby area when the nozzle for the preceding lot is returned to the standby area before supplying the coating liquid from the nozzle for the preceding lot to the last substrate of the preceding lot loaded in the first liquid processing unit.

9. A non-transitory storage medium storing a computer program used in a coating device for forming a coating film by supplying a coating liquid obtained by dissolving a component of a coating film in a solvent from a nozzle to a substrate kept in a liquid processing unit, the coating device comprising:

first and second liquid processing units; and a movement mechanism configured such that a nozzle for a preceding lot and a nozzle for a following lot are integrated and moved between an upper side of the first liquid processing unit and a standby area, wherein the computer program includes a group of steps to execute the coating method described in claim 1.

* * * * *